(12) United States Patent
Feng et al.

(10) Patent No.: US 8,555,226 B1
(45) Date of Patent: Oct. 8, 2013

(54) AUTOMATIC VERIFICATION OF DEPENDENCY

(75) Inventors: Xiushan Feng, Austin, TX (US); Jayanta Bhadra, Austin, TX (US); Ashish Goel, Noida (IN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/603,402

(22) Filed: Sep. 4, 2012

(51) Int. Cl.
*G06F 17/50* (2006.01)
(52) U.S. Cl.
USPC .......................................... 716/111
(58) Field of Classification Search
USPC ................................. 716/100, 111
See application file for complete search history.

(56) References Cited

U.S. PATENT DOCUMENTS

| | | | |
|---|---|---|---|
| 2007/0074137 A1* | 3/2007 | Nishida et al. | 716/5 |
| 2013/0014091 A1* | 1/2013 | Oshima et al. | 717/137 |
| 2013/0019224 A1* | 1/2013 | Madl et al. | 717/104 |

OTHER PUBLICATIONS

Jain et al., "A Survey of Techniques for Formal Verification of Combinational Circuits," Proceedings of the 1997 International Conference on Computer Design (ICCD '97), Nov. 1997, 10 pages.
Feng, "Formal Equivalence Checking of Software Specification vs. Hardware Implementation,"Section 2.4.3, PhD thesis, University of British Columbia, Jan. 2007.
Boule et al., "Assertion Checkers—Enablers of Quality Design," 1st Microsystems and Nanoelectronics Research Conference, Oct. 2008, 4 pages.
Mony et al., "Exploiting Suspected Redundancy without Proving It," Proceedings of the 42nd Design Automation Conference, DAC 2005, Jun. 2005, 6 pages.
Mukherjee et al., "An Efficient Filter-Based Approach for Combinational Verification," IEEE Transactions on Computer-Aided Design of Integrated Circuits and Systems, vol. 18, No. 11, Nov. 1999, pp. 1542-1557.
Brand, "Verification of Large Synthesized Designs," 1993 IEEE/ACM International Conference on Computer-Aided Design, Nov. 1993, pp. 534-537.

* cited by examiner

*Primary Examiner* — Suchin Parihar
(74) *Attorney, Agent, or Firm* — Van Leeuwen & Van Leeuwen; David Dolezal

(57) ABSTRACT

An approach is provided in which a formal verification tool sends a condition signal to a first circuit instance and to a second circuit instance, which are both instances of an electric circuit design. The formal verification tool selects a common input port and sends a first input value to the common input port of the first circuit instance and sends a second input value, which is different than the first input value, to the common input port of the second circuit instance. In turn, the first circuit instance generates a first output value and the second circuit instance generates a second instance value, which are utilized to verify dependencies between the electronic circuit's input ports and output ports.

20 Claims, 12 Drawing Sheets

AUTOMATIC VERIFICATION OF DEPENDENCY

TECHNICAL FIELD

The present disclosure relates to automatically verifying dependencies in an electronic circuit design through formal verification.

BACKGROUND

Formal verification is an algorithmic-based approach that proves functional properties about an electronic design. Formal verification may include equivalence checking and model checking. Equivalence checking verifies the functional equivalence of two designs that are at the same or different abstraction levels (e.g., RTL-to-RTL, RTL-to-Gate, or Gate-to-Gate). Equivalence checking is used for design implementation verification. Model checking verifies that the implementation satisfies the properties of the design. Although formal verification exhaustively proves functional properties about the electronic design, it does not check input/output dependencies included in the electronic design.

BRIEF DESCRIPTION THE SEVERAL VIEWS OF THE DRAWINGS

The present disclosure may be better understood, and its numerous objects, features, and advantages made apparent to those skilled in the art by referencing the accompanying drawings, wherein.

DETAILED DESCRIPTION

This disclosure includes embodiments that tests input/output dependencies of an electronic circuit through formal verification. A formal verification tool sends a condition signal to a first circuit instance and to a second circuit instance, which are both instances of an electric circuit design. The formal verification tool selects a common input port and sends a first input value to the common input port of the first circuit instance and sends a second input value, which is different than the first input value, to the common input port of the second circuit instance. In turn, the first circuit instance generates a first output value and the second circuit instance generates a second instance value, which are utilized to verify one or more dependencies between the electronic circuit's input ports and output ports.

The following detailed description will generally follow the summary of the disclosure, as set forth above, further explaining and expanding the definitions of the various aspects and embodiments of the disclosure as necessary.

Figure 1:
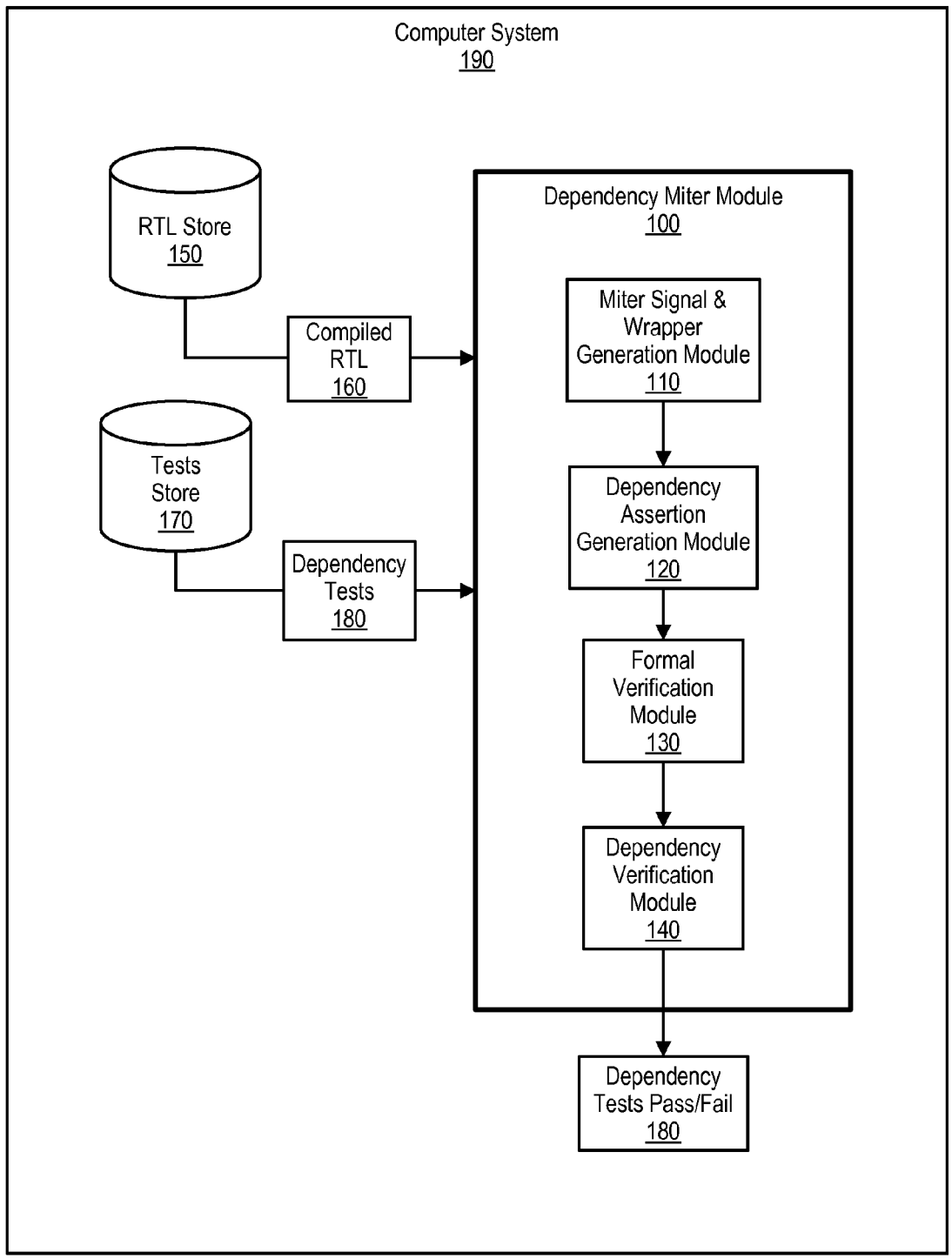
FIG. 1 is a diagram showing a dependency miter module testing dependencies of an electronic circuit design.

FIG. 1 is a diagram showing a dependency miter module testing dependencies of an electronic circuit design. Computer system 190 includes dependency miter module 100 that, in one embodiment, treats an electronic circuit design as a "black box." In this embodiment, dependency miter module 100 creates a "dependency miter wrapper" around a first circuit instance of the electronic circuit design. In one embodiment, dependency miter module 100 creates an instance of a compiled RTL (register-transfer level) description (compiled RTL 160) of the electronic circuit design (prior to synthesis).

The dependency miter wrapper includes input/output logic and a second circuit instance that, in one embodiment, is identical to the first circuit instance. By sending different input values into the different circuit instances under specified conditions, the output values from the two circuit instances are compared to determine whether dependency exists between the output signals and the input signals under the specific conditions.

Dependency miter module 100 retrieves compiled RTL (register-transfer level) 160 from RTL store 150, which is a compiled version of the electronic circuit design. Dependency miter module 100 also retrieves dependency test 180 from tests store 170. In one embodiment, dependency test 180 part of a group of user-defined tests that check whether a particular output is dependent/non-dependent upon a particular input under a particular condition. For example, a dependency test may check whether "output X" is dependent upon changes to "input A" under a condition when "input C" is high (see FIG. 2 and corresponding text for further details).

Miter signal and wrapper generation module 110 analyzes dependency tests and creates miter signals that correspond to input identifiers, output identifiers, and condition identifiers included in dependency test 180 (and other dependency tests stored in tests store 170). Module 110 also utilizes compiled RTL 160 to create two circuit instances of the electronic circuit design (e.g., a circuit instance and a miter circuit instance), as well as input/output mux logic that, in one embodiment, are wrapped into a dependency miter wrapper (see FIG. 3 and corresponding text for further details).

Dependency assertion generation module 120 generates dependency assertions according to dependency test 180 and miter signals generated by module 110. The dependency assertions are utilized by formal verification module 130 to formally verify the electronic circuit design and provide conclusive results of the dependency assertions. Module 130 generates formal verification results that are sent to dependency verification module 140. In one embodiment, the formal verification results may include pass/fail formal verification results, which correspond to particular outputs depending/not depending upon particular inputs under particular conditions, respectively.

Dependency verification module 140 utilizes the formal verification results to verify dependency test 180 and generates dependency tests pass/fail results 180 that, in turn, a circuit designer may utilize to identify bugs in compiled RTL 160.

Figure 2:
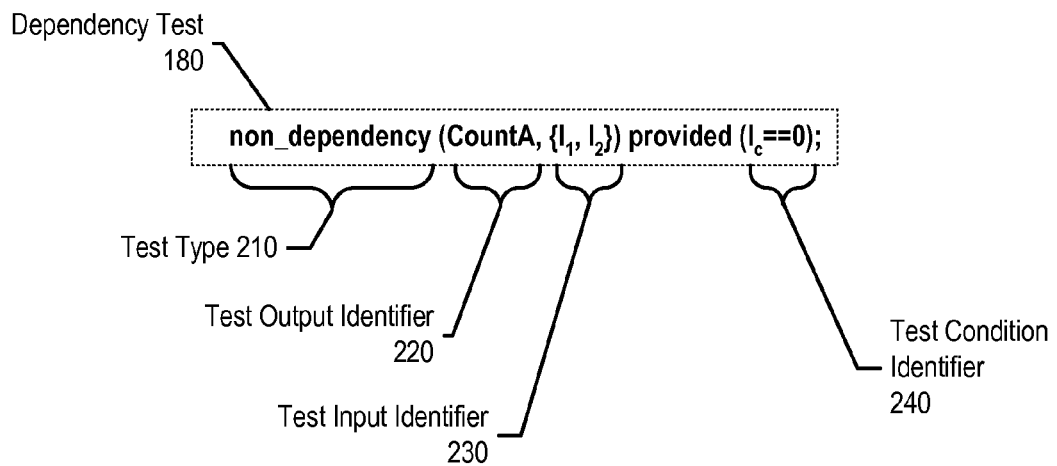
FIG. 2 shows an example of a dependency test.

FIG. 2 shows an example of a dependency test. Dependency test 180, in one embodiment, is provided by a user, which includes test type 210, test output identifier 220, test input identifier 230 and test condition identifier 240.

Test type 210 may be a "dependent" test type or a "non-dependent" test type, which tests for dependency or non-dependency between one or more inputs and an output. Test output identifier 220 identifies a particular output signal/port of the electronic circuit design, and test input identifier 230 identifies one or more input signals/ports included in the electronic circuit design. Test condition identifier 240 identifies a particular input signal and a condition of the input signal, which may specify a Boolean expression, such as a logic relation (e.g., a && b||c>4).

As such, dependency test 180 tests whether "Count A" is non-dependent upon changes to inputs "I1" and/or "I2" under the condition when input signal "Ic" equals "0."

Figure 3:
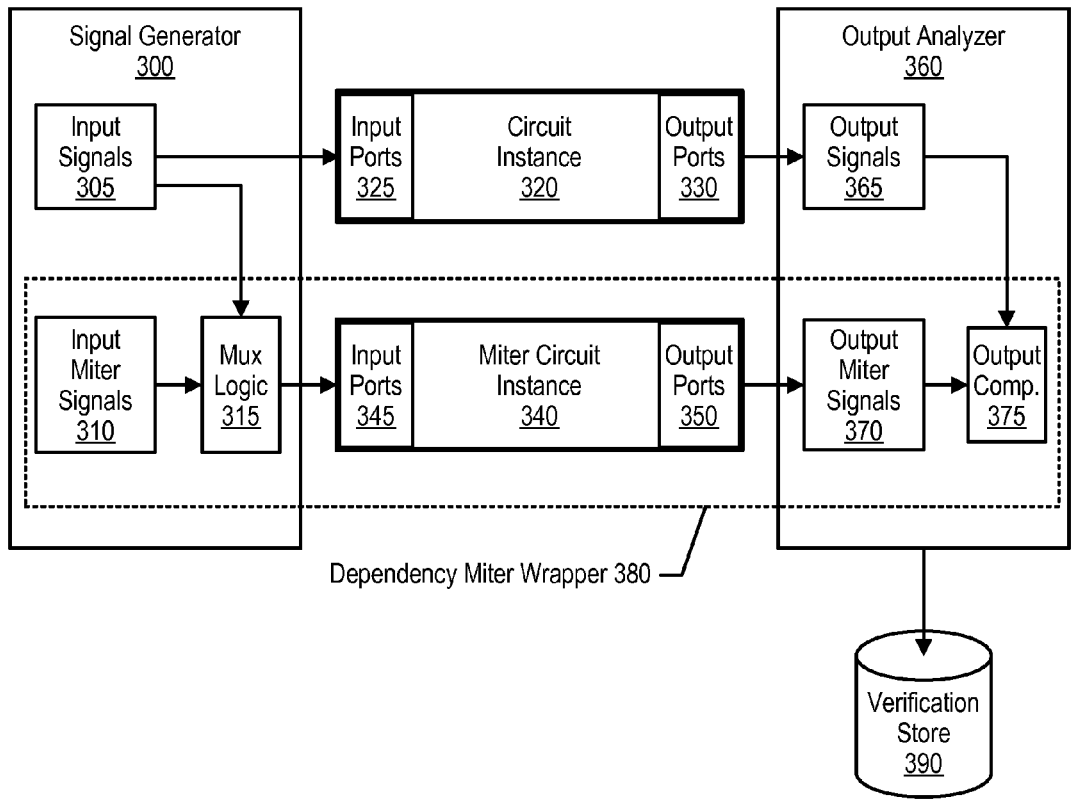
FIG. 3 is a diagram showing a block diagram representation of a dependency miter wrapper's components.

FIG. 3 is a diagram showing a block diagram representation of a dependency miter wrapper's components. Circuit instance 320 and miter circuit instance 340 are instances of the same electronic circuit design. As such, input ports 325 match input ports 345, and output ports 330 match output ports 350.

Signal generator 300 generates input values on input signals and input miter signals 310. Input miter signals 310 correspond to input signals that are under test by one or more dependency tests (see FIG. 7 and corresponding text for further details). Mux logic 315, in one embodiment, combines various condition signals to feed into miter circuit instance, such as when either of two conditions are true (see FIG. 5 and corresponding text for further details). As those skilled in the art can appreciate, multiplexers and logic gates discussed herein may be implemented in System Verilog Assertions (SVA's) for formal verification.

Output analyzer 360 receives output values from output ports 330 and 350 via output signals 365 and 370, respectively. In turn, output analyzer 360 utilizes output comparator 375 to determine whether corresponding output values match. In turn, output analyzer 360 stores the comparison results as formal verification results in verification store 390.

Figure 4:
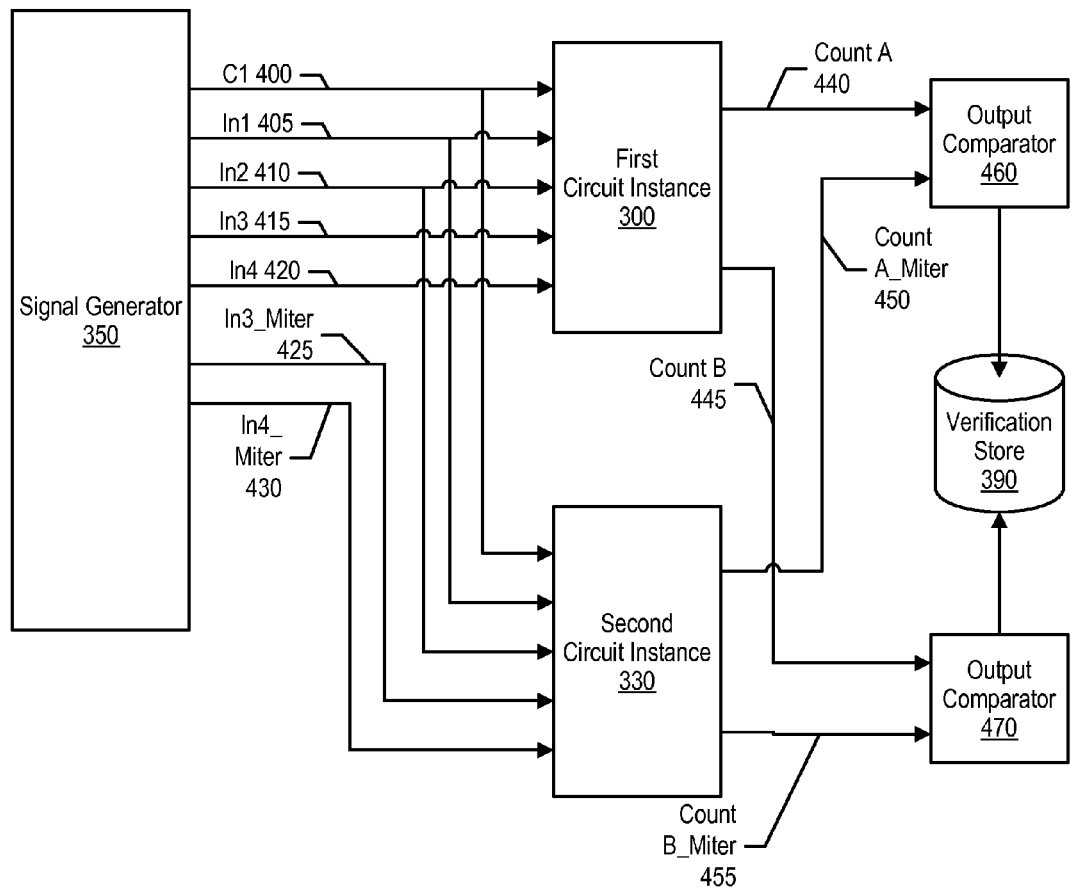
FIG. 4 is an exemplary diagram showing a block diagram representation of formally verifying an electronic circuit design.

FIG. 4 is an exemplary diagram showing a block diagram representation of formally verifying an electronic circuit design. The example in FIG. 4 shows that signal 400 is a common condition signal that feeds into first circuit instance 300 and second circuit instance 330 at the same port (e.g., input port x). Inputs 405 and 410 also feed into both circuit instances, indicating that these inputs are not involved in a dependency test but are rather used as common inputs.

Inputs 415 and 420, however, have corresponding input miter signals 425 and 430. Inputs 415 and 420 feed into first circuit instance 300 and inputs 425 and 430 feed into second circuit instance 330. As such, during formal verification, signal generator 350 activates a specific condition using input signal 400 and sends one or more different values on inputs 425 and 430 compared to inputs 415 and 420, respectively.

First circuit instance has outputs 440 and 445, and second circuit instance has corresponding outputs 450 and 455, respectively. Output comparator 460 checks whether the same output value exists on outputs 440 and 450, and stores a pass/fail result in verification store 390 accordingly (e.g., pass if output values are the same, fail if output values are not the same). Output comparator 470 checks whether the same output value exists on outputs 445 and 455, and stores a pass/fail result in verification store 390 accordingly. In turn, dependency verification module 140 analyzes the formal verification results to determine whether dependencies/non-dependencies between the electronic circuit design's inputs and outputs are correct (see FIG. 10 and corresponding text for further details).

Figure 5:
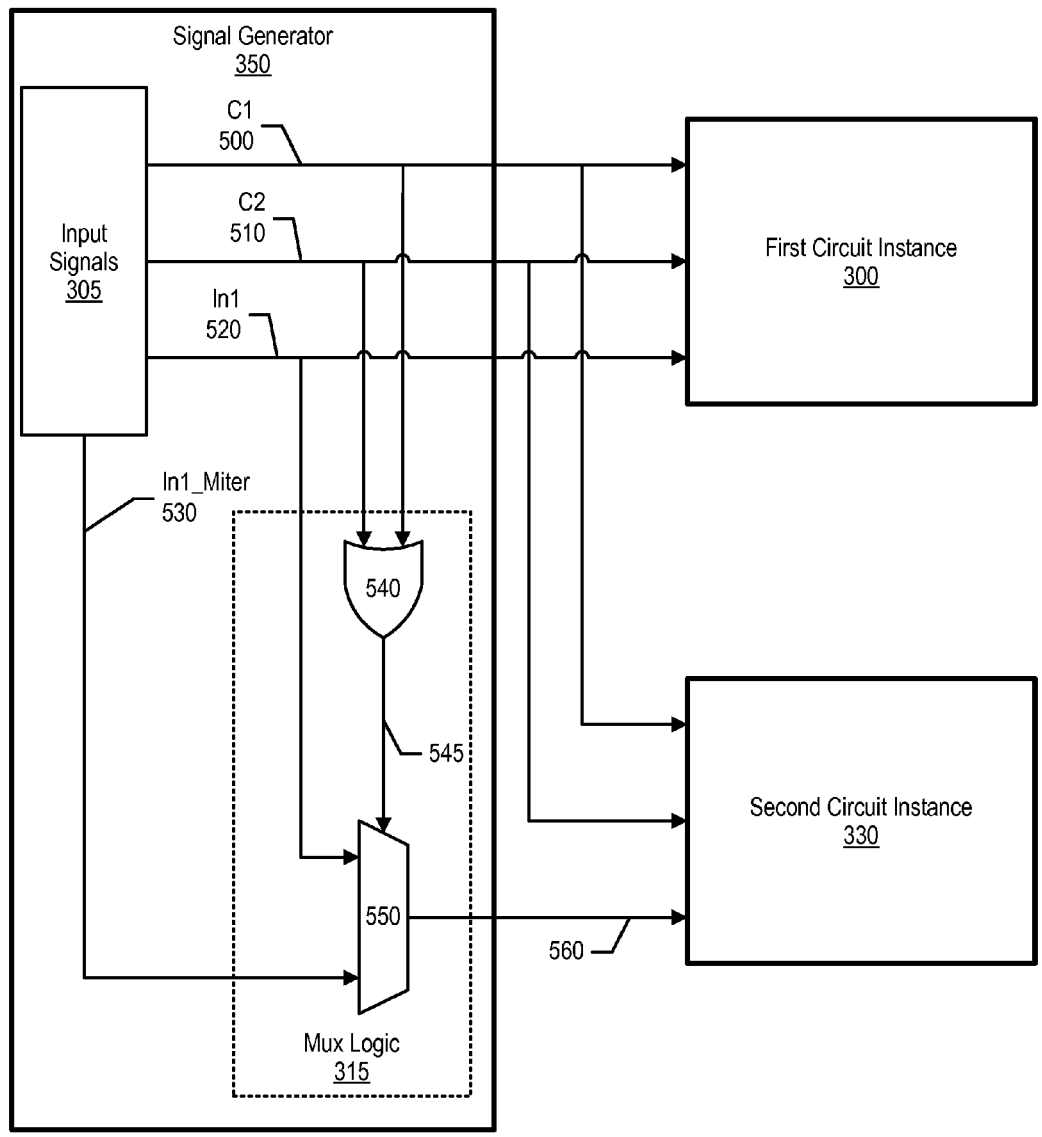
FIG. 5 is an exemplary diagram showing a signal generator that multiplexes condition inputs that feed into a second circuit instance.

FIG. 5 is an exemplary diagram showing a signal generator that includes multiplexer logic that multiplexes condition inputs feeding into a second circuit instance. The diagram in FIG. 5 illustrates a dependency test that checks whether circuit instance outputs depend upon input In1 520 under condition c1||c2 (i.e., either c1 500 is true or c2 510 is true).

Mux logic 315, in this embodiment, includes multiplexer 550 and OR gate 540. Multiplexer 550 is controlled by OR gate 540's output 545, which selects either IN1 520 or IN1_Miter 530 as its input to send to second circuit instance 330 (output 560). Output 560 is either In1 520 (when neither c1 500 nor c2 510 is true) or In1_Miter 530 (when either c1 500 or c2 510 is true). As those skilled in the art can appreciate and as discussed earlier, multiplexers and logic gates discussed herein may be implemented in System Verilog Assertions (SVA's) for formal verification.

Figure 6:
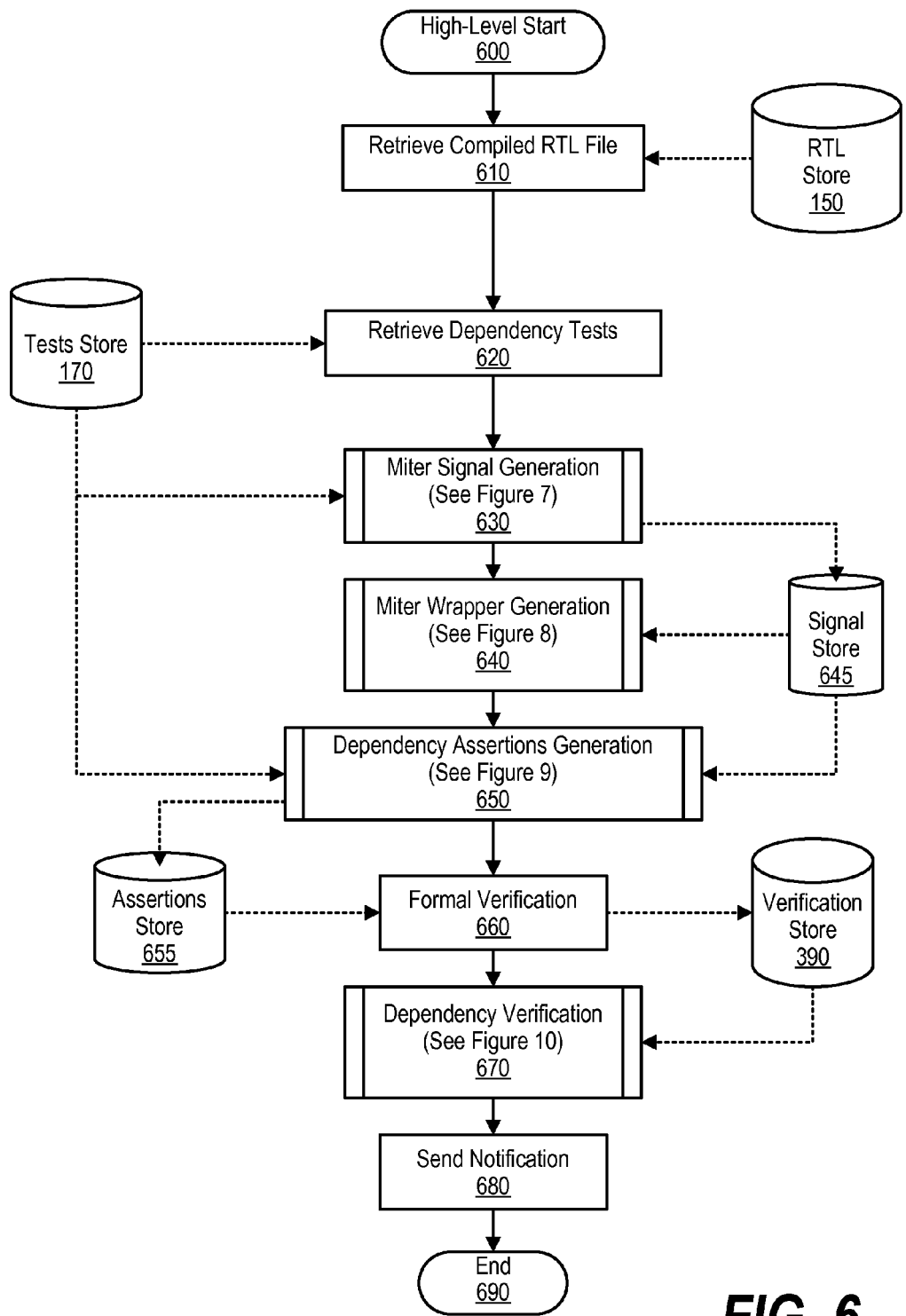
FIG. 6 is a high-level flowchart showing steps taken in generating a dependency miter wrapper and verifying dependency tests.

FIG. 6 is a high-level flowchart showing steps taken in generating a dependency miter wrapper and verifying dependency tests. Processing commences at 600, whereupon processing retrieves a compiled electronic circuit design file from RTL store 150 at step 610. At step 620, processing retrieves dependency test from tests store 170. In one embodiment, dependency tests are supplied by a user to check whether an output is dependent upon an input value given a particular condition (see FIG. 2 and corresponding text for further details).

The dependency tests include test input identifiers, test output identifiers, and test condition identifiers, each corresponding input ports or output ports of the electronic circuit design. Processing analyzes the dependency tests and creates input/output signals and miter signals (stored in signal store 645) corresponding to the test input identifiers and test output identifiers that are eventually assigned to a second circuit instance of the electronic circuit design (pre-defined process block 630, see FIG. 7 and corresponding text for further details).

Figure 8:
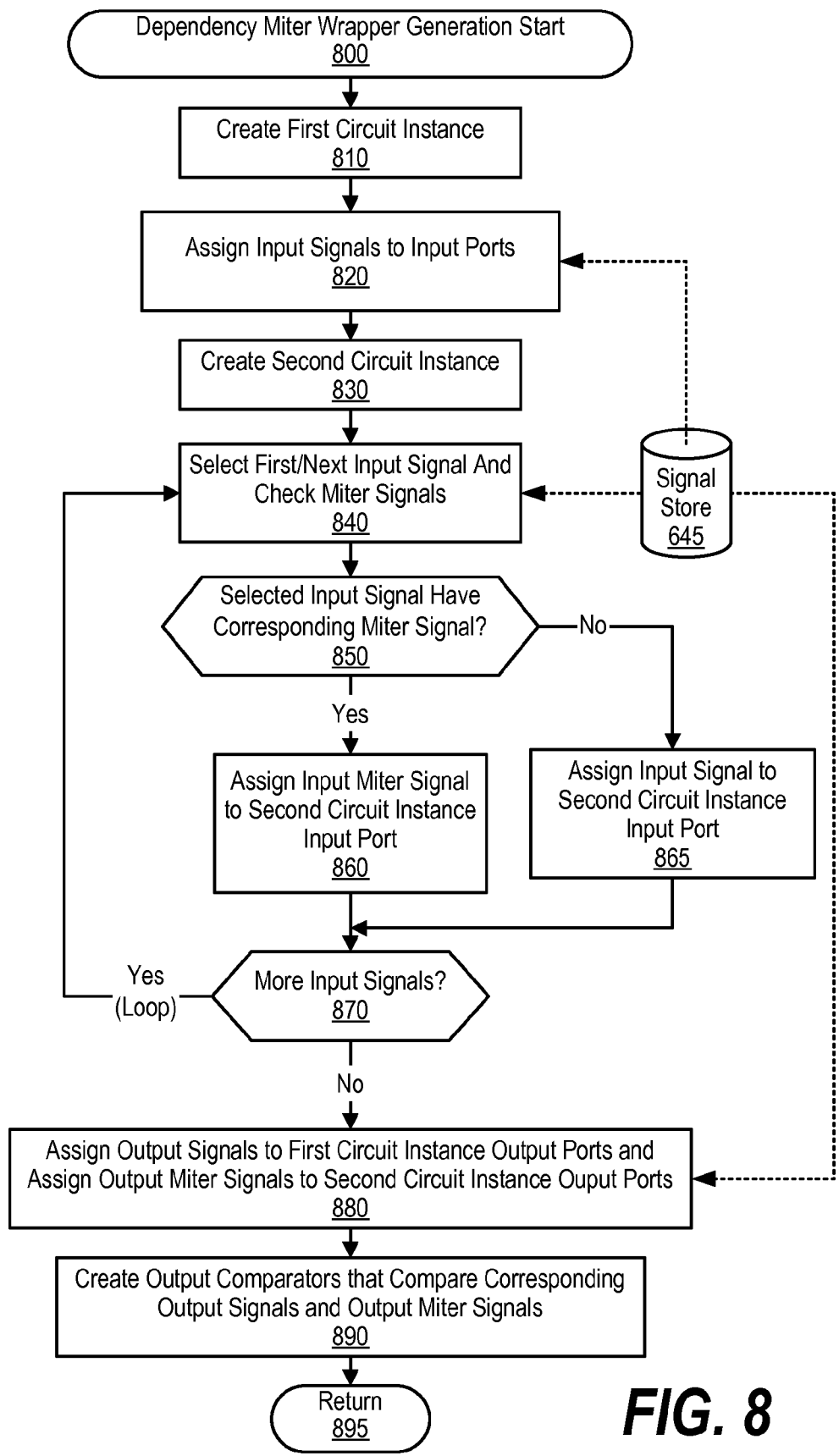
FIG. 8 is a flowchart showing steps taken in generating a dependency miter wrapper.

Processing creates a dependency miter wrapper that includes the second circuit instance, input signals (includes miter input signals), and output signals (includes output miter signals) that are stored in signal store 645 (pre-defined process block 640, see FIG. 8 and corresponding text for further details).

In addition, processing analyzes the dependency tests and created signals, and automatically generates dependency assertions that are stored in assertions store 655. The dependency assertions include assertion inputs that correspond to the test input identifiers, assertion outputs that correspond to the output identifier, and assertion conditions that correspond to the test condition identifier and may also correspond to input miter signals (pre-defined process block 650, see FIG. 9 and corresponding text for further details).

At step 660, processing performs formal verification using the dependency miter wrapper and the dependency assertions stored in 655. In one embodiment, the formal verification entails model checking, which includes a systematically exhaustive exploration of mathematical models corresponding to the dependency miter wrapper and the dependency assertions. In this embodiment, processing explores all states and transitions in the mathematical model using smart and domain-specific abstraction techniques to consider whole groups of states in a single operation and reduce computing time. The verification results, in one embodiment, include pass/fail values that indicate whether the output value of the first circuit instance matches the output value of the second circuit instance. The verification results are stored in verification store 390.

Figure 10:
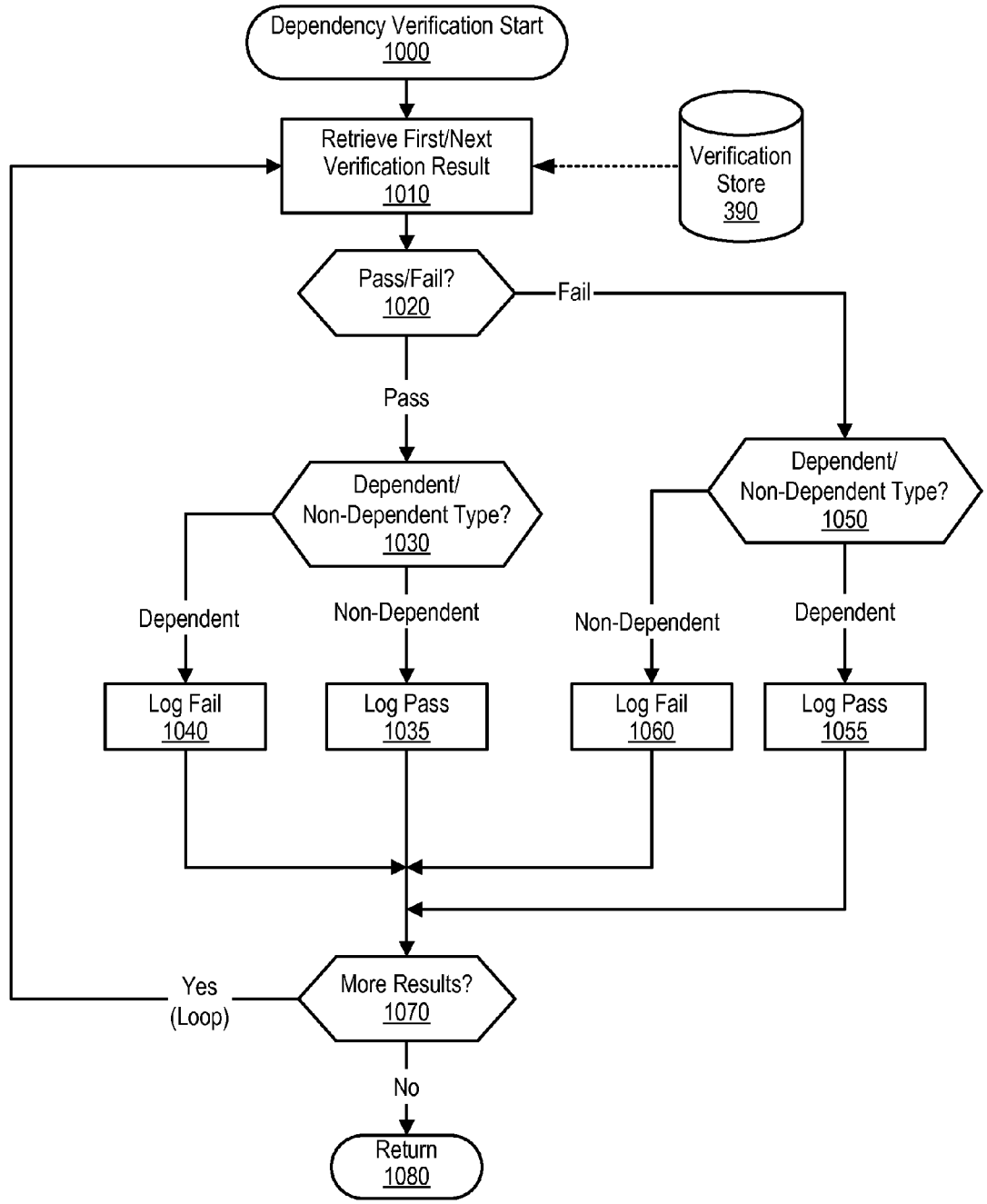
FIG. 10 is a flowchart showing steps taken in verifying dependency tests in an electronic circuit design based upon verification results.

As such, processing verifies the dependency tests utilizing the verification results stored verification store 390 (pre-defined process block 670, see FIG. 10 and corresponding text for further details). For example, a "dependent" dependency test's corresponding dependency assertion should produce a verification result of "fail" because the output value should be dependent upon the input value given the particular condition (the second circuit instance's output value should be different than the first circuit instance's output value). Similarly, a "non-dependent" dependency test's corresponding dependency assertion should produce a verification result of "pass" because the output value should be independent from the input value given the particular condition (the second circuit instance's output value should be the same as the first circuit instance's output value).

Processing sends a notification at step 680 that indicates the results of the dependency verification, and ends at 690.

Figure 7:
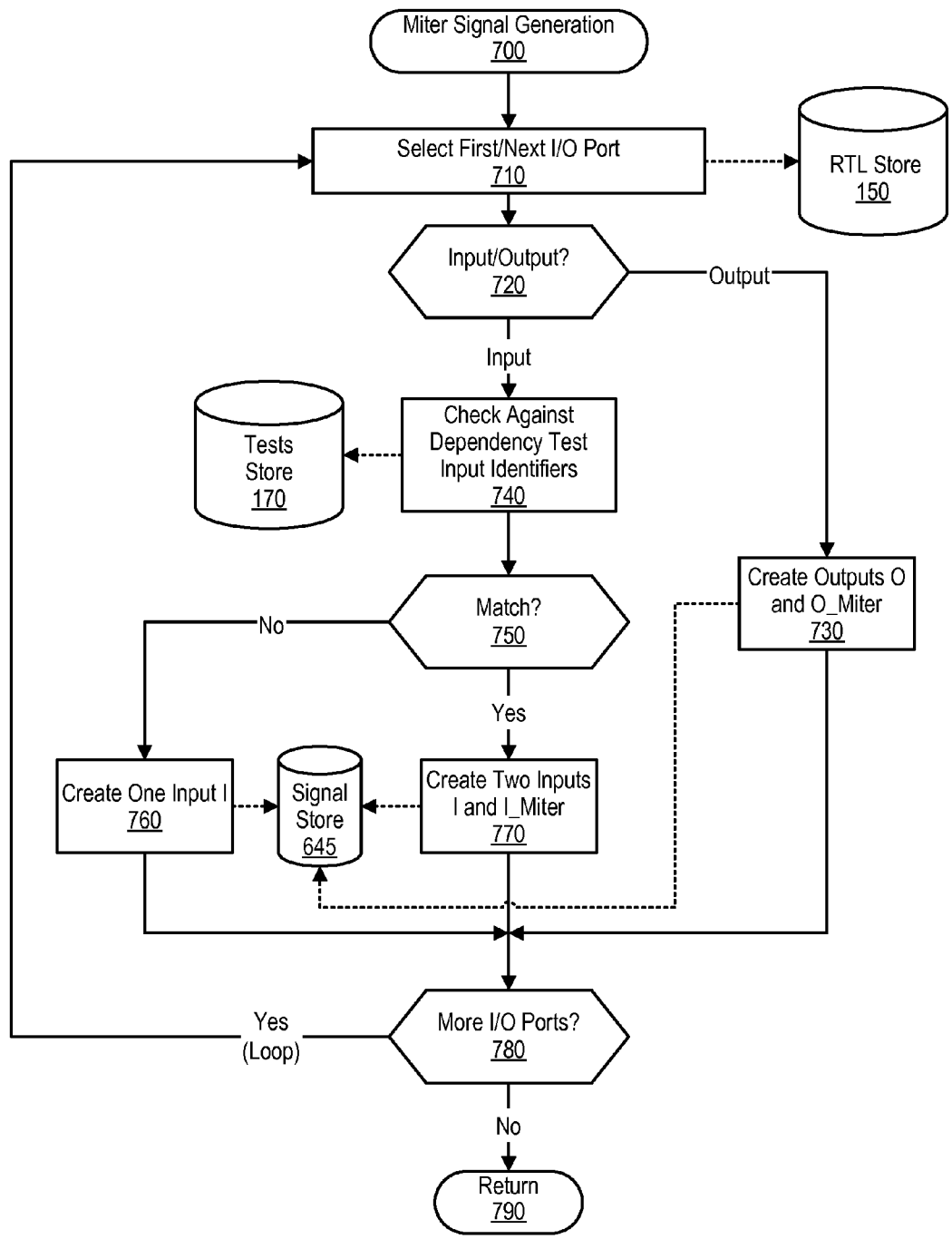
FIG. 7 is a flowchart showing steps taken in generating miter signals to assign to a second circuit instance.

FIG. 7 is a flowchart showing steps taken in generating miter signals to assign to a second circuit instance. Processing generates miter signals for each output signal and generates miter signals for input signals that are utilized in dependency tests. As such, the input miter signals may be utilized during formal verification to inject input values that are different than the input miter signal's corresponding input signal in order to determine whether the corresponding output signal is dependent upon the input signal given a particular condition.

Processing commences at 700, whereupon processing selects a first input/output (I/O) port (i.e. input/output port identifier) from the electronic circuit design's compiled RTL file included in RTL store 150 (step 710). A determination is made as to whether the selected port is an input or output (decision 720). If the selected port is an output port, decision 720 branches to the "Output" branch, whereupon processing creates outputs "O" and "O_Miter" (i.e. creates two RTL lines of code that includes two output signal identifiers) and stores the outputs in signal store 645 (step 730).

On the other hand, if the selected port is an input port, decision 720 branches to the "Input" branch, whereupon processing checks the selected input (input port identifier) against dependency tests' test input identifiers in tests store 170 at step 740 (e.g., test input identifier 230 shown in FIG. 2). For example, if the selected input port is "Input D," then processing checks whether one or more of the dependency tests include an "input identifier D." A determination is made as to whether processing found a match (decision 750). If processing found a match, decision 750 branches to the "Yes" branch, whereupon processing creates two inputs "I" and "I_Miter" (i.e. creates two RTL lines of code that includes two input signal identifiers) at step 770, and stores the two inputs in signal store 645.

On the other hand, if a match is not found, decision 750 branches to the "No" branch, whereupon processing creates one input "I" (i.e. creates an RTL line of code that includes an input signal identifier) at step 760, which is assigned to both the first circuit instance and second circuit instance (see FIG. 8 and corresponding text for further details).

A determination is made as to whether there are more I/O ports to evaluate (decision 780). If there are more I/O ports to evaluate, decision 780 branches to the "Yes" branch, which loops back to select and process the next I/O port. This looping continues until there are no more I/O ports to evaluate, at which point decision 780 branches to the "No" branch, whereupon processing returns at 790.

FIG. 8 is a flowchart showing steps taken in generating a dependency miter wrapper. Processing commences at 800, whereupon processing creates a first circuit instance of an electronic circuit design at step 810. At step 820, processing assigns input signals to the first circuit instance's input ports. For example, input signal A is assigned to input port A on the first circuit instance.

At step 830, processing creates a second circuit instance of the electronic circuit. Processing, at step 840, selects the second circuit instance's first input signal (e.g., input signal A) and checks whether a corresponding miter signal exists in signal store 645 (step 840). The miter signals were previously stored in signal store 645 during the evaluation of the dependency tests shown in FIG. 7.

A determination is made as to whether signal store 645 includes a corresponding input miter signal (decision 850). If a corresponding input miter signal exists, decision 850 branches to the "Yes" branch, whereupon processing assigns the input miter signal to the second circuit instance's corresponding input port (step 860). On the other hand, if a corresponding miter signal does not exists, decision 850 branches to the "No" branch, whereupon processing assigns the input signal to the second circuit instance in the input module (step 865).

A determination is made as to whether the second circuit instance includes more input signals (decision 870). If the second circuit instance includes more input signals, decision 870 branches to the "Yes" branch, whereupon processing loops back to process the next input signal. This looping continues until there are no more input signals to process, at which point decision 870 branches to the "No" branch, whereupon processing assigns output signals to the first circuit instance's output ports and assigns output miter signals to the second circuit instance's output ports (step 880). At step 890, processing creates output comparators to compare output results from corresponding output signals (e.g., output A's value compared to miter output A's value). Processing returns at 895.

Figure 9:
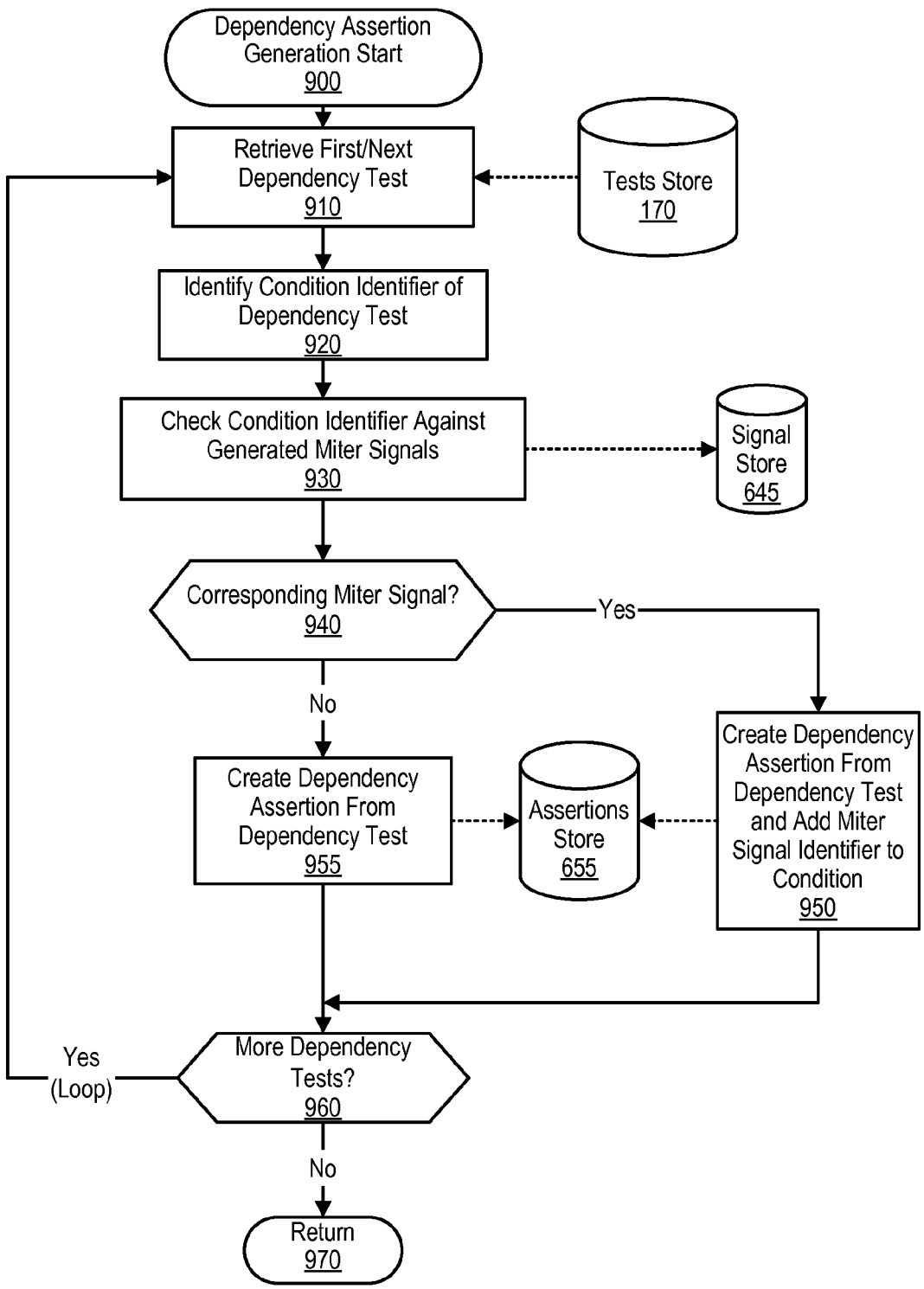
FIG. 9 is a flowchart showing steps taken in generating dependency assertions based upon dependency tests.

FIG. 9 is a flowchart showing steps taken in generating dependency assertions based upon dependency tests. Processing commences at 900, whereupon processing retrieves a first dependency test from tests store 170 at step 910. At step 920, processing identifies the condition identifier included in the dependency test, and checks the condition identifier against generated miter signals included in signal store 645 (step 930). For example, if the condition input identifier is "Input 3," then processing checks whether a miter signal of "Input 3-Miter" was generated during signal generation, such as for a different dependency test that uses "Input 3" as an input identifier. In this embodiment, the "Input 3-Miter" is included in a dependency assertion in order to adequately control the second circuit instance.

A determination is made as to whether signal store 645 includes miter signal that corresponds to the condition identifier (decision 940). If there is a corresponding miter signal, decision 940 branches to the "Yes" branch, whereupon processing creates a dependency assertion according to the dependency test and also adds a miter signal identifier to the condition, which processing stores in assertions store 655 (step 950). Using dependency test 180 as an example, the dependency assertion may be represented as:

dep (CountA, {If1, If2}) provided (Iq==0 & Iq_miter==0)

On the other hand, if the condition identifier does not have a corresponding miter signal, decision 940 branches to the "No" branch, whereupon processing creates the dependency assertion based upon the dependency test without a miter signal (step 955). Using dependency test 180 as an example, the dependency assertion may be represented as:

dep (CountA, {If1, If2}) provided (Iq==0)

A determination is made as to whether there are more dependency tests to evaluate (decision 960). If there are more dependency tests to evaluate, decision 960 branches to the "Yes" branch, whereupon processing retrieves and evaluates the next dependency test. This looping continues until there are no more dependency tests to evaluate, at which point decision 960 branches to the "No" branch, whereupon processing ends at 970.

FIG. 10 is a flowchart showing steps taken in verifying dependency tests in an electronic circuit design based upon verification results. Processing performs formal verification on an electronic circuit using a dependency miter wrapper such as that shown in FIG. 3. The formal verification includes dependency assertions that are generated from dependency tests, which check whether an output value is dependent upon a particular input value when a condition input is true (see FIG. 2 and corresponding text for further details).

Processing commence at 1000, whereupon, processing retrieves a first verification result from verification store 390 (step 1010). Verification store 390, in one embodiment, includes pass and fail results corresponding to various dependency assertions that were executed during formal verification. In this embodiment, a pass indicates that output values from the first circuit instance and the second instance are the same, whereas a fail indicates that the output values were different. As such, the pass results should correspond to non-dependent assertion types and the fail results should correspond to dependent assertion types.

A determination is made as to whether the retrieved verification result is a pass or fail result (decision 1020). If the value is a pass, decision 1020 branches to the "Yes" branch, whereupon a determination is made as to whether the corresponding dependency test is a dependency test type or a non-dependency type (decision 1030). If it is a non-dependency type, decision 1030 branches to the "non-dependency" branch, whereupon processing logs a Pass in a dependency assertion results table (step 1035). That is, the formal verification results indicate that the output results were the same (miter output value did not change when the miter input value changed under a specific condition) and the dependency test is testing non-dependency.

On the other hand, if it is a dependency test type, decision 1030 branches to the "dependency" branch, whereupon processing logs a "Fail" in the dependency assertion results table (step 1040). The reason for the failure is because the dependency test was testing for dependency between the output miter value and the input miter value and, since the verification results were the same, the miter output value did not depend upon the changed miter input value.

Referring back to decision 1020, if the verification result is a "Fail," decision 1020 branches to the "Fail" branch, whereupon a decision is made as to whether the corresponding dependency assertion is a dependency type or a non-dependency type (decision 1050). If it is a non-dependency test type, decision 1050 branches to the "non-dependency" branch, whereupon processing logs a Fail in the dependency assertion results table (step 1060). That is, the formal verification results indicate that the output results were different and, therefore, the miter output value was dependent upon the changed miter input value.

On the other hand, if it is a dependency test type, decision 1050 branches to the "dependency" branch, whereupon processing logs a "Pass" in the dependency assertion results table (step 1055). The reason for logging a pass is because the formal verification result indicates the output results were different (decision 1020) and the dependency test is testing for dependency.

A determination is made as to whether there are more verification results to analyze (decision 1070). If there are more verification results to analyze, decision 1070 branches to the "Yes" branch, whereupon processing loops back to retrieve and analyze the next verification result. This looping continues until there are no more results to analyze, at which point decision 1070 branches to the "No" branch, whereupon processing returns at 1080.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The description of the present disclosure has been presented for purposes of illustration and description, but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

As will be appreciated by one skilled in the art, aspects of the present disclosure may be embodied as a system, method or computer program product. Accordingly, aspects of the present disclosure may take the form of an entirely hardware embodiment, a software embodiment (including firmware, resident software, micro-code, etc.), including processing circuitry for executing thereof, or an embodiment combining software and hardware aspects that may all generally be referred to herein as a "circuit," "module" or "system." Furthermore, aspects of the present disclosure may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program, in a non-transitory fashion, for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing.

Computer program code for carrying out operations for aspects of the present disclosure may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present disclosure are described below with reference to flowchart illustrations and/or block diagrams of methods, apparatus (systems) and computer program products according to embodiments of the disclosure. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

Figure 11:
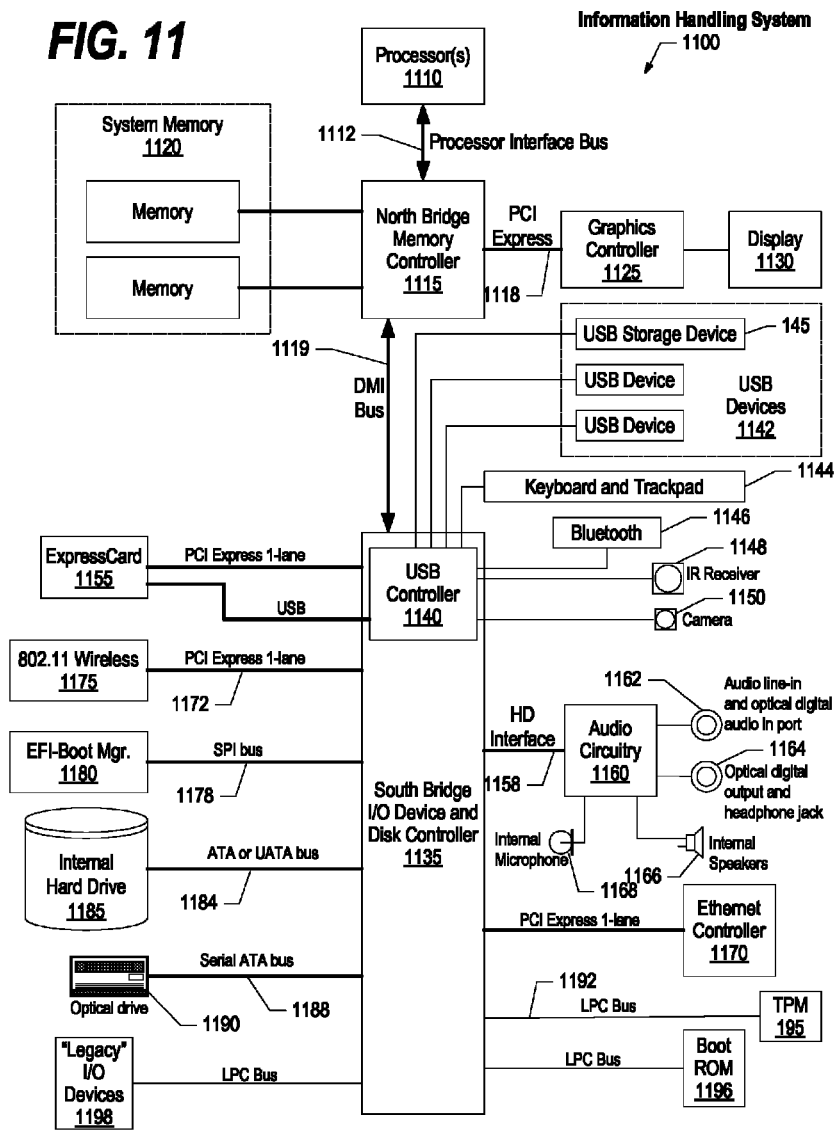
FIG. 11 is a block diagram of a data processing system in which the methods described herein can be implemented.

FIG. 11 illustrates information handling system 1100, which is a simplified example of a computer system capable of performing the computing operations described herein. Information handling system 1100 includes one or more processors 1110 coupled to processor interface bus 1112. Processor interface bus 1112 connects processors 1110 to Northbridge 1115, which is also known as the Memory Controller Hub (MCH). Northbridge 1115 connects to system memory 1120 and provides a means for processor(s) 1110 to access the system memory. Graphics controller 1125 also connects to Northbridge 1115. In one embodiment, PCI Express bus 1118 connects Northbridge 1115 to graphics controller 1125. Graphics controller 1125 connects to display device 1130, such as a computer monitor.

Northbridge 1115 and Southbridge 1135 connect to each other using bus 1119. In one embodiment, the bus is a Direct Media Interface (DMI) bus that transfers data at high speeds in each direction between Northbridge 1115 and Southbridge 1135. In another embodiment, a Peripheral Component Interconnect (PCI) bus connects the Northbridge and the Southbridge. Southbridge 1135, also known as the I/O Controller Hub (ICH) is a chip that generally implements capabilities that operate at slower speeds than the capabilities provided by the Northbridge. Southbridge 1135 typically provides various busses used to connect various components. These busses include, for example, PCI and PCI Express busses, an ISA bus, a System Management Bus (SMBus or SMB), and/or a Low Pin Count (LPC) bus. The LPC bus often connects low-bandwidth devices, such as boot ROM 1196 and "legacy" I/O devices (using a "super I/O" chip). The "legacy" I/O devices (1198) can include, for example, serial and parallel ports, keyboard, mouse, and/or a floppy disk controller. The LPC bus also connects Southbridge 1135 to Trusted Platform Module (TPM) 1195. Other components often included in Southbridge 1135 include a Direct Memory Access (DMA) controller, a Programmable Interrupt Controller (PIC), and a storage device controller, which connects Southbridge 1135 to nonvolatile storage device 1185, such as a hard disk drive, using bus 1184.

ExpressCard 1155 is a slot that connects hot-pluggable devices to the information handling system. ExpressCard 1155 supports both PCI Express and USB connectivity as it connects to Southbridge 1135 using both the Universal Serial Bus (USB) the PCI Express bus. Southbridge 1135 includes USB Controller 1140 that provides USB connectivity to devices that connect to the USB. These devices include webcam (camera) 1150, infrared (IR) receiver 1148, keyboard and trackpad 1144, and Bluetooth device 1146, which provides for wireless personal area networks (PANs). USB Controller 1140 also provides USB connectivity to other miscellaneous USB connected devices 1142, such as a mouse, removable nonvolatile storage device 1145, modems, network cards, ISDN connectors, fax, printers, USB hubs, and many other types of USB connected devices. While removable nonvolatile storage device 1145 is shown as a USB-connected device, removable nonvolatile storage device 1145 could be connected using a different interface, such as a Firewire interface, etcetera.

Wireless Local Area Network (LAN) device 1175 connects to Southbridge 1135 via the PCI or PCI Express bus 1172. LAN device 1175 typically implements one of the IEEE 802.11 standards of over-the-air modulation techniques that all use the same protocol to wireless communicate between information handling system 1100 and another computer system or device. Optical storage device 1190 connects to Southbridge 1135 using Serial ATA (SATA) bus 1188. Serial ATA adapters and devices communicate over a high-speed serial link. The Serial ATA bus also connects Southbridge 1135 to other forms of storage devices, such as hard disk drives. Audio circuitry 1160, such as a sound card, connects to Southbridge 1135 via bus 1158. Audio circuitry 1160 also provides functionality such as audio line-in and optical digital audio in port 1162, optical digital output and headphone jack 1164, internal speakers 1166, and internal microphone 1168. Ethernet controller 1170 connects to Southbridge 1135 using a bus, such as the PCI or PCI Express bus. Ethernet controller 1170 connects information handling system 1100 to a computer network, such as a Local Area Network (LAN), the Internet, and other public and private computer networks.

While FIG. 11 shows one information handling system, an information handling system may take many forms. For example, an information handling system may take the form of a desktop, server, portable, laptop, notebook, or other form factor computer or data processing system. In addition, an information handling system may take other form factors such as a personal digital assistant (PDA), a gaming device, ATM machine, a portable telephone device, a communication device or other devices that include a processor and memory.

The Trusted Platform Module (TPM 1195) shown in FIG. 11 and described herein to provide security functions is but one example of a hardware security module (HSM). Therefore, the TPM described and claimed herein includes any type of HSM including, but not limited to, hardware security devices that conform to the Trusted Computing Groups (TCG) standard, and entitled "Trusted Platform Module (TPM) Specification Version 1.2." The TPM is a hardware security subsystem that may be incorporated into any number of information handling systems, such as those outlined in FIG. 12.

Figure 12:
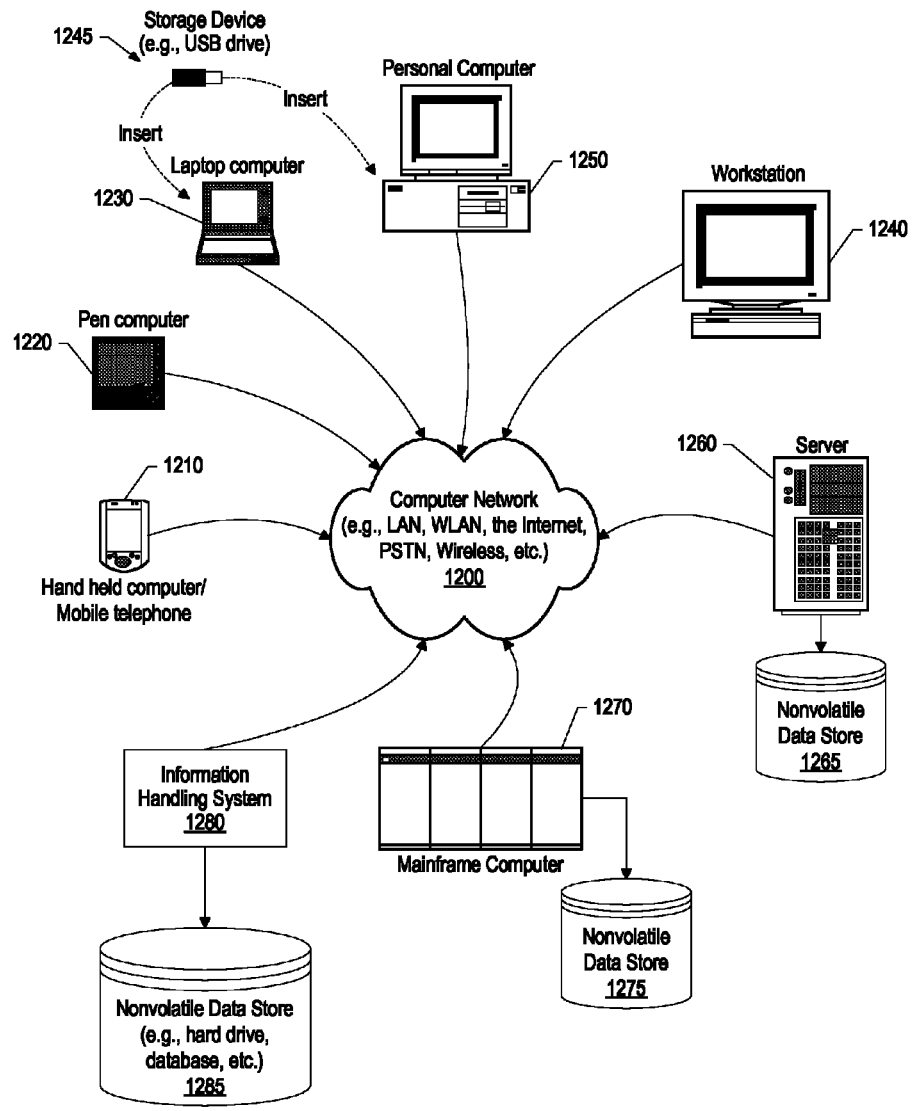
FIG. 12 provides an extension of the information handling system environment shown in FIG. 11 to illustrate that the methods described herein can be performed on a wide variety of information handling systems which operate in a networked environment.

FIG. 12 provides an extension of the information handling system environment shown in FIG. 11 to illustrate that the methods described herein can be performed on a wide variety of information handling systems that operate in a networked environment. Types of information handling systems range from small handheld devices, such as handheld computer/mobile telephone 1210 to large mainframe systems, such as mainframe computer 1270. Examples of handheld computer 1210 include personal digital assistants (PDAs), personal entertainment devices, such as MP3 players, portable televisions, and compact disc players. Other examples of information handling systems include pen, or tablet, computer 1220, laptop, or notebook, computer 1230, workstation 1240, personal computer system 1250, and server 1260. Other types of information handling systems that are not individually shown in FIG. 12 are represented by information handling system 1280. As shown, the various information handling systems can be networked together using computer network 1200. Types of computer network that can be used to interconnect the various information handling systems include Local Area Networks (LANs), Wireless Local Area Networks (WLANs), the Internet, the Public Switched Telephone Network (PSTN), other wireless networks, and any other network topology that can be used to interconnect the information handling systems. Many of the information handling systems include nonvolatile data stores, such as hard drives and/or nonvolatile memory. Some of the information handling systems shown in FIG. 12 depicts separate nonvolatile data stores (server 1260 utilizes nonvolatile data store 1265, mainframe computer 1270 utilizes nonvolatile data store 1275, and information handling system 1280 utilizes nonvolatile data store 1285). The nonvolatile data store can be a component that is external to the various information handling systems or can be internal to one of the information handling systems. In addition, removable nonvolatile storage device 1145 can be shared among two or more information handling systems using various techniques, such as connecting the removable nonvolatile storage device 1145 to a USB port or other connector of the information handling systems.

While particular embodiments of the present disclosure have been shown and described, it will be obvious to those skilled in the art that, based upon the teachings herein, that changes and modifications may be made without departing from this disclosure and its broader aspects. Therefore, the appended claims are to encompass within their scope all such changes and modifications as are within the true spirit and scope of this disclosure. Furthermore, it is to be understood that the disclosure is solely defined by the appended claims. It will be understood by those with skill in the art that if a specific number of an introduced claim element is intended, such intent will be explicitly recited in the claim, and in the absence of such recitation no such limitation is present. For non-limiting example, as an aid to understanding, the following appended claims contain usage of the introductory phrases "at least one" and "one or more" to introduce claim elements. However, the use of such phrases should not be construed to imply that the introduction of a claim element by the indefinite articles "a" or "an" limits any particular claim containing such introduced claim element to disclosures containing only one such element, even when the same claim includes the introductory phrases "one or more" or "at least one" and indefinite articles such as "a" or "an"; the same holds true for the use in the claims of definite articles.

The invention claimed is:

1. A method comprising:
   sending a common condition signal to a first circuit instance and to a second circuit instance, wherein the first and second circuit instances are instances of a same electronic circuit design that includes one or more input ports and at least one output port;
   selecting a common input port from the one or more input ports;
   sending a first input value to the selected common input port of the first circuit instance, wherein the sending the first input value results in a first output value at the first circuit instance's output port;
   sending a second input value to the selected common input port of the second circuit instance, wherein the second input value is different than the first input value, and wherein the sending the second input value results in a second output value at the second circuit instance's output port; and
   verifying, by one or more processors, one or more dependencies between the one or more input ports and the at least one output port based on a comparison of the first output value and the second output value.

2. The method of claim 1 wherein at least one dependency test corresponds to the verification of the one or more dependencies, and wherein the dependency test includes a test output identifier, a test condition identifier, and one or more test input identifiers, the method further comprising:
   for each of the one or more input ports:
      determining whether an input port identifier corresponding to the input port matches one of the one or more test input identifiers;
      in response to determining that input port identifier matches one of the one or more test input identifiers, creating a first input signal identifier and a second input signal identifier, wherein the first input signal identifier is assigned to the first circuit instance and the second input signal identifier is assigned to the second circuit instance; and
      in response to determining that the input port identifier fails to match one or more of the test input identifiers, creating the first input signal identifier and assigning the first input signal identifier to the first circuit instance and the second circuit instance; and
   for each of the at least one output ports:
      creating a first output signal identifier and a second output signal identifier that corresponds the test output identifier; and
      assigning the first output signal identifier to the first circuit instance and assigning the second output signal identifier to the second circuit instance.

3. The method of claim 2 further comprising:
   creating a dependency assertion based upon the dependency test, the creating further comprising:

including one or more assertion inputs in the dependency assertion that corresponds to the one or more test input identifiers;

including an assertion output in the dependency assertion that corresponds to the test output identifier;

determining whether the test condition identifier matches one or more of the created second input signal identifiers;

in response to determining that the test condition identifier corresponds to one or more of the created second input signal identifiers, including a first assertion condition and a second assertion condition in the dependency assertion, the first assertion condition corresponding to the test condition identifier and the second assertion condition corresponding to the matched second input signal identifier.

4. The method of claim 3 further comprising:

mathematically analyzing one or more formal models corresponding to the first circuit instance and the second circuit instance according to the dependency assertion during the sending of the common condition signal, the first input value, and the second input value.

5. The method of claim 3 wherein the first output value matches the second output value, the method further comprising:

determining a test type of the dependency assertion;

in response to determining that the test type is a non-dependency test type, indicating that the dependency test is true; and in response to determining that the test type is a dependency test type, indicating that the dependency test is false.

6. The method of claim 3 wherein the first output value and the second output value are different values, the method further comprising:

determining a test type of the dependency assertion;

in response to determining that the test type is a dependency test type, indicating that the dependency test is true; and in response to determining that the test type is a non-dependency test type, indicating that the dependency test is false.

7. The method of claim 1 wherein the common condition signal is based upon a plurality of dependency tests that each include a different test condition identifier.

8. An information handling system comprising:

one or more processors;

one or more memories accessible by at least one of the processors;

a formal verification module accessible by at least one of the processors that invokes a common condition signal on a first circuit instance and a second circuit instance, wherein the first and second circuit instances are instances of a same electronic circuit design that includes one or more input ports and at least one output port;

selection logic included in the formal verification module that selects a common input port from the one or more input ports;

first input generation logic included in the formal verification module that invokes a first input value on the selected common input port of the first circuit instance, wherein the invoking the first input value results in a first output value at the first circuit instance's output port;

second input generation logic included in the formal verification module that invokes a second input value on the selected common input port of the second circuit instance, wherein the second input value is different than the first input value, and wherein the invoking the second input value results in a second output value at the second circuit instance's output port; and a dependency verification module accessible by at least one of the processors that verifies one or more dependencies between the one or more input ports and the at least one output port based on a comparison of the first output value and the second output value.

9. The information handling system of claim 8 wherein at least one dependency test corresponds to the verification of the one or more dependencies, and wherein the dependency test includes a test output identifier, a test condition identifier, and one or more test input identifiers, the information handling system further comprising:

a miter signal and wrapper generation module that, for each of the one or more input ports:

determines whether an input port identifier corresponding to the input port matches one of the one or more test input identifiers;

in response to determining that input port identifier matches one of the one or more test input identifiers, creates a first input signal identifier and a second input signal identifier, wherein the first input signal identifier is assigned to the first circuit instance and the second input signal identifier is assigned to the second circuit instance; and in response to determining that the input port identifier fails to match one or more of the test input identifiers, creates the first input signal identifier and assigning the first input signal identifier to the first circuit instance and the second circuit instance; and a miter signal and wrapper generation module that, for each of at least one output ports:

creates a first output signal identifier and a second output signal identifier that corresponds the test output identifier; and assigns the first output signal identifier to the first circuit instance and assigning the second output signal identifier to the second circuit instance.

10. The information handling system of claim 9 further comprising:

a dependency assertion generation module that creates a dependency assertion based upon the dependency test, wherein the dependency assertion generation module:

includes one or more assertion inputs in the dependency assertion that corresponds to the one or more test input identifiers;

includes an assertion output in the dependency assertion that corresponds to the test output identifier;

determines whether the test condition identifier matches one or more of the created second input signal identifiers;

in response to determining that the test condition identifier corresponds to one or more of the created second input signal identifiers, includes a first assertion condition and a second assertion condition in the dependency assertion, the first assertion condition corresponding to the test condition identifier and the second assertion condition corresponding to the matched second input signal identifier.

11. The information handling system of claim 10 further comprising:

analysis logic included in the formal verification module that mathematically analyzes one or more formal models corresponding to the first circuit instance and the second circuit instance according to the dependency assertion during the sending of the common condition signal, the first input value, and the second input value.

12. The information handling system of claim 10 wherein the first output value matches the second output value, the information handling system further comprising:
   determination logic included in the dependency verification module that determines a test type of the dependency assertion;
   indication logic included in the dependency verification module that:
      indicates that the dependency test is true in response to determining that the test type is a non-dependency test type; and
      indicates that the dependency test is false in response to determining that the test type is a dependency test type.

13. The information handling system of claim 10 wherein the first output value and the second output value are different values, the information handling system further comprising:
   determination logic included in the dependency verification module that determines a test type of the dependency assertion;
   indication logic included in the dependency verification module that:
      indicates that the dependency test is true in response to determining that the test type is a dependency test type; and
      indicates that the dependency test is false in response to determining that the test type is a non-dependency test type.

14. The information handling system of claim 8 wherein the common condition signal is based upon a plurality of dependency tests that each include a different test condition identifier.

15. A computer program product stored in a computer readable storage medium, comprising computer program code that, when executed by an information handling system, causes the information handling system to perform actions comprising:
   sending a common condition signal to a first circuit instance and to a second circuit instance, wherein the first and second circuit instances are instances of a same electronic circuit design that includes one or more input ports and at least one output port;
   selecting a common input port from the one or more input ports;
   sending a first input value to the selected common input port of the first circuit instance, wherein the sending the first input value results in a first output value at the first circuit instance's output port;
   sending a second input value to the selected common input port of the second circuit instance, wherein the second input value is different than the first input value, and wherein the sending the second input value results in a second output value at the second circuit instance's output port; and
   verifying one or more dependencies between the one or more input ports and the at least one output port based on a comparison of the first output value and the second output value.

16. The computer program product of claim 15 wherein at least one dependency test corresponds to the verification of the one or more dependencies, and wherein the dependency test includes a test output identifier, a test condition identifier, and one or more test input identifiers and wherein the computer readable storage medium stores additional instructions that, when executed by the information handling system, cause the information handling system to perform additional actions comprising:
   for each of the one or more input ports:
      determining whether an input port identifier corresponding to the input port matches one of the one or more test input identifiers;
      in response to determining that input port identifier matches one of the one or more test input identifiers, creating a first input signal identifier and a second input signal identifier, wherein the first input signal identifier is assigned to the first circuit instance and the second input signal identifier is assigned to the second circuit instance; and
      in response to determining that the input port identifier fails to match one or more of the test input identifiers, creating the first input signal identifier and assigning the first input signal identifier to the first circuit instance and the second circuit instance; and
   for each of the at least one output ports:
      creating a first output signal identifier and a second output signal identifier that corresponds the test output identifier; and
      assigning the first output signal identifier to the first circuit instance and assigning the second output signal identifier to the second circuit instance.

17. The computer program product of claim 16 wherein computer readable storage medium stores additional instructions that, when executed by the information handling system, cause the information handling system to perform additional actions comprising:
   creating a dependency assertion based upon the dependency test, the creating further comprising:
      including one or more assertion inputs in the dependency assertion that corresponds to the one or more test input identifiers;
      including an assertion output in the dependency assertion that corresponds to the test output identifier;
      determining whether the test condition identifier matches one or more of the created second input signal identifiers;
      in response to determining that the test condition identifier corresponds to one or more of the created second input signal identifiers, including a first assertion condition and a second assertion condition in the dependency assertion, the first assertion condition corresponding to the test condition identifier and the second assertion condition corresponding to the matched second input signal identifier.

18. The computer program product of claim 17 wherein computer readable storage medium stores additional instructions that, when executed by the information handling system, cause the information handling system to perform additional actions comprising:
   mathematically analyzing one or more formal models corresponding to the first circuit instance and the second circuit instance according to the dependency assertion during the sending of the common condition signal, the first input value, and the second input value.

19. The computer program product of claim 17 wherein the first output value matches the second output value, and wherein the computer readable storage medium stores additional instructions that, when executed by the information handling system, cause the information handling system to perform additional actions comprising:
   determining a test type of the dependency assertion;

in response to determining that the test type is a non-dependency test type, indicating that the dependency test is true; and in response to determining that the test type is a dependency test type, indicating that the dependency test is false.

20. The computer program product of claim 17 wherein the first output value and the second output value are different values, and wherein the computer readable storage medium stores additional instructions that, when executed by the information handling system, cause the information handling system to perform additional actions comprising:

determining a test type of the dependency assertion;

in response to determining that the test type is a dependency test type, indicating that the dependency test is true; and in response to determining that the test type is a non-dependency test type, indicating that the dependency test is false.

* * * * *